United States Patent [19]
Arai et al.

[11] Patent Number: 5,744,931
[45] Date of Patent: Apr. 28, 1998

[54] BATTERY REMAINING CAPACITY MEASURING APPARATUS

[75] Inventors: Youichi Arai; Hiroshi Ichikawa, both of Susono, Japan

[73] Assignee: Yazaki Corporation, Tokyo, Japan

[21] Appl. No.: 705,677

[22] Filed: Aug. 30, 1996

[30] Foreign Application Priority Data

Sep. 1, 1995 [JP] Japan ................... 7-225312

[51] Int. Cl.[6] .................................................. H01M 10/46
[52] U.S. Cl. ............................ 320/43; 320/48; 324/428
[58] Field of Search .......................... 320/13, 21, 29, 320/30, 31, 32, 39, 40, 43, 44, 48; 324/427, 428, 429, 433; 340/636; 429/90; 364/481, 483

[56] References Cited

U.S. PATENT DOCUMENTS

| | | | |
|---|---|---|---|
| 4,849,700 | 7/1989 | Morioka et al. | 324/427 |
| 5,391,193 | 2/1995 | Thompson | 324/430 |
| 5,617,324 | 4/1997 | Arai | 320/48 X |

*Primary Examiner*—Edward Tso
*Attorney, Agent, or Firm*—Oblon, Spivak, McClelland, Maier & Neustadt, P.C.

[57] ABSTRACT

A remaining capacity operation portion 19 provides an approximate linear function (I=aV+b) having a voltage-current characteristic by a method of least squares according to an open circuit voltage when a load 1 is disconnected to a battery 3, a closed circuit voltage when a battery 3 is connected to a load 1 which is detected for every predetermined time and a current passing through a load, where a reference value (I<0) is substituted in this approximate linear function, which a display portion 27 displays as an remaining capacity voltage.

2 Claims, 7 Drawing Sheets

CHANGE OF A REMAINING CAPACITY
VOLTAGE WHEN SUBSTITUTING I=0

WHEN SUBSTITUTING I=-10 (A)

5,744,931

BATTERY REMAINING CAPACITY MEASURING APPARATUS

BACKGROUND OF THE INVENTION

1. Field of the Invention

The invention relates to a battery remaining capacity measuring apparatus which estimates a battery remaining capacity in accordance with an approximate linear function.

2. Description of the Related Art

It has been preferably considered that a remaining capacity of an electric car is calculated by assuming that it reduces approximately in a straight line.

For example, an open circuit voltage (that is, a state of disconnecting a load from a battery) is measured five minutes after connecting to a predetermined load, and then an open circuit voltage approximately reduces in a straight line as time passes by, as shown in FIG. 1.

Accordingly, an open circuit voltage is detected when a battery is completely disconnected from a load. By using the open circuit voltage as a parameter, a battery remaining capacity voltage is showed as a reduction in a straight line while an electric car is running after a detection.

This estimate of a battery remaining capacity is operated as follows. A plurality of battery voltage V and a load passing through a current are sampled for every predetermined time. Where, a previously detected open circuit voltage, its voltage and current are used so that an approximate linear function (I=aV+b) can be obtained by a method of least squares. Thereby, a reference value (I=0) is substituted in this approximate linear function so that an actual battery remaining capacity voltage is estimated.

However, a buttery does not show a usual open circuit voltage and an open circuit voltage does not appear immediately even if a battery is disconnected to a load.

Accordingly, when detecting an open circuit voltage of a battery, sometimes a voltage value corresponding to that of an open and closed circuit is detected.

In such a case, as shown in FIG. 2, if an electric car makes 100 rounds on a predetermined road when a predetermined load is applied and the remaining capacity voltages are plotted, a reduction of a remaining capacity voltage shows a curved line not a straight line.

That is, the problem is that there is occurred more or less error between a remaining capacity voltage shown in an approximate linear function and an actual remaining capacity voltage.

Furthermore, since a steeply curved line appears especially near where a remaining capacity shows 0, there is a problem. That is, when a remaining capacity reduces as time passes by, if a value of 0 is substituted in I in order to obtain a remaining capacity voltage by using an approximate line, there is occurred more error between an actual remaining capacity voltage and an obtained remaining capacity voltage.

SUMMARY OF THE INVENTION

It is an object of the present invention to obtain a battery remaining capacity measuring apparatus which enables to obtain a remaining capacity voltage with no error, compared with an actual remaining capacity voltage.

According to a first aspect of the invention, a battery remaining capacity measuring apparatus for measuring an open circuit until a battery is connected to a load together with a start of an operation, for measuring a plurality of a closed circuit voltage and a current for every predetermined time after a state of the closed circuit, and for obtaining an approximate linear function (I=aV+b) which shows a voltage-current characteristic according to the voltage and current comprises a remaining capacity operation portion for obtaining a voltage value whereby a reference value (I<0) is substituted in the approximate linear function (I=aV+b) whenever the approximate linear function, and for displaying the voltage value as a remaining capacity operation portion. An approximate linear function (I=aV+b) with a voltage-current characteristic can be obtained by a method of least squares according to an open circuit voltage, a closed circuit voltage and a current. Where, an open circuit voltage is a voltage when a battery is not connected to a load, a closed circuit voltage is a voltage when a battery is connected to a load, and a current is passing through a load. A reference value (I<0) is substituted in this approximate linear function (I=aV+b) in order to display it as an actual remaining capacity voltage.

According to a second aspect of the invention, a remaining capacity operation portion comprises: a line extension means for creating an approximate line where an approximate linear function is extended on a coordinate axis having −I axis and +V axis; and a remaining capacity calculation means for obtaining a voltage value on an intersecting point where an approximate line crosses at a reference value (I<0), so that the voltage value can be displayed as a remaining capacity voltage. Accordingly, it is usually possible to easily obtain a remaining capacity corresponding to a reference value (I=−10).

DETAILED DESCRIPTION OF THE PREFERRED EMBODIMENTS

An embodiment of the present invention will be described hereinafter with reference to the accompanying drawings.

Figure 1:
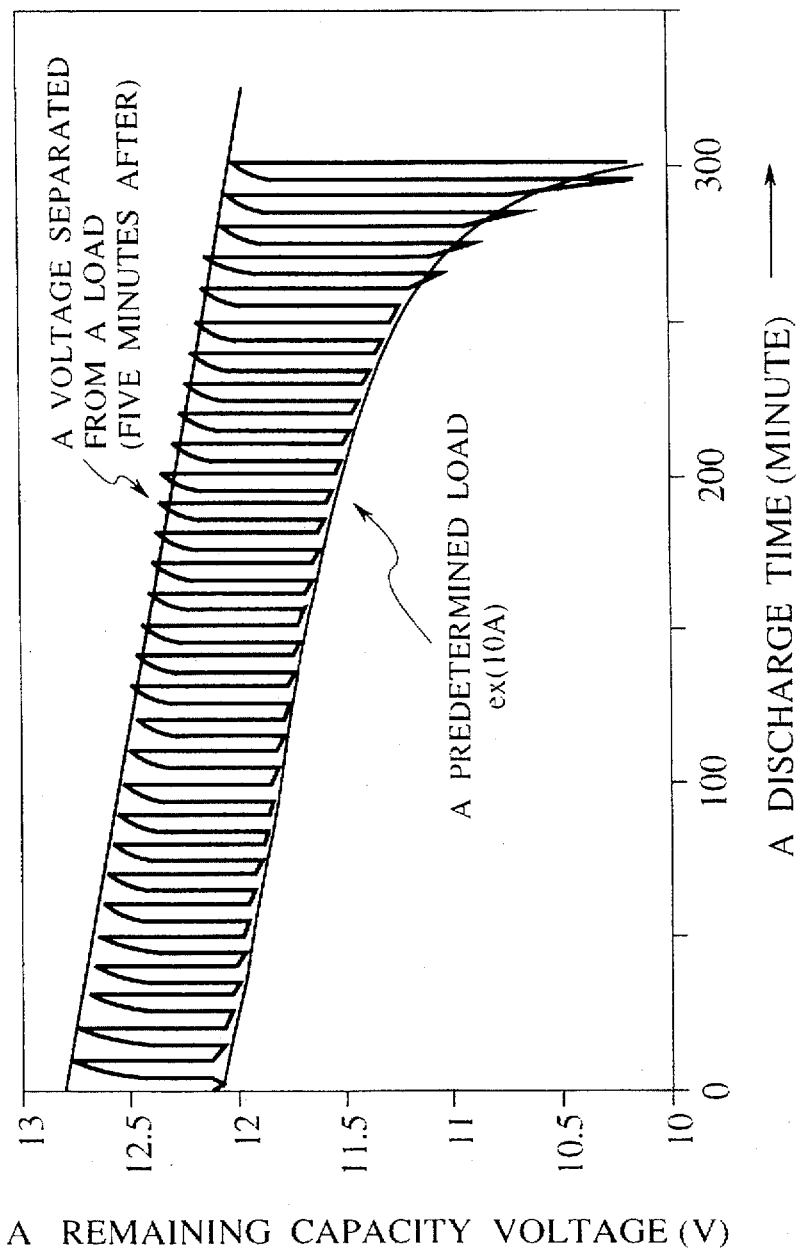
FIG. 1 is a diagram showing a change of an open circuit voltage.
Figure 2:
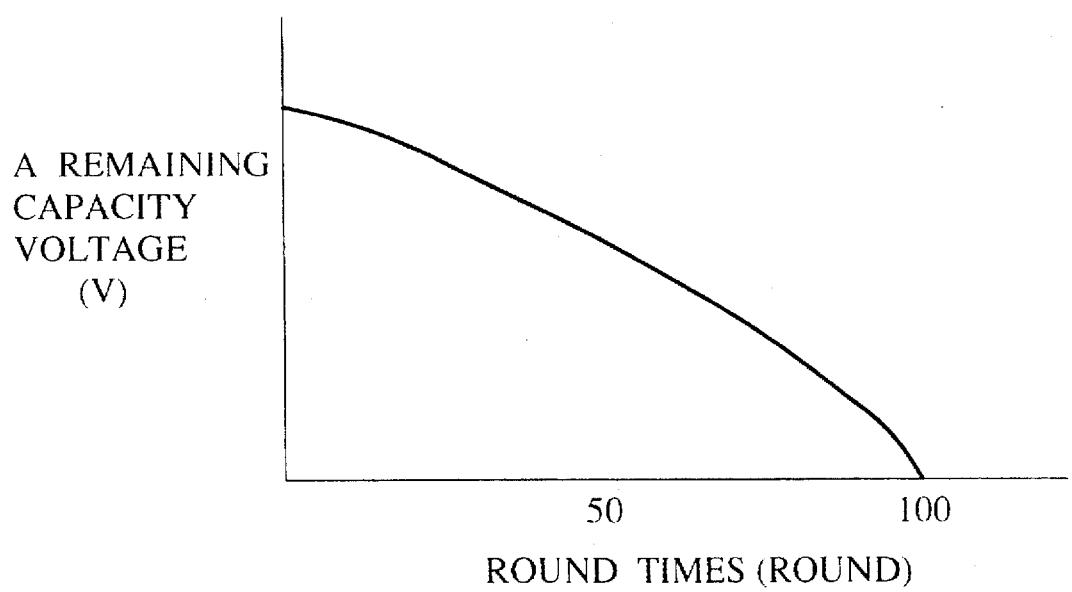
FIG. 2 is a diagram showing the problems of a conventional art.
Figure 3:
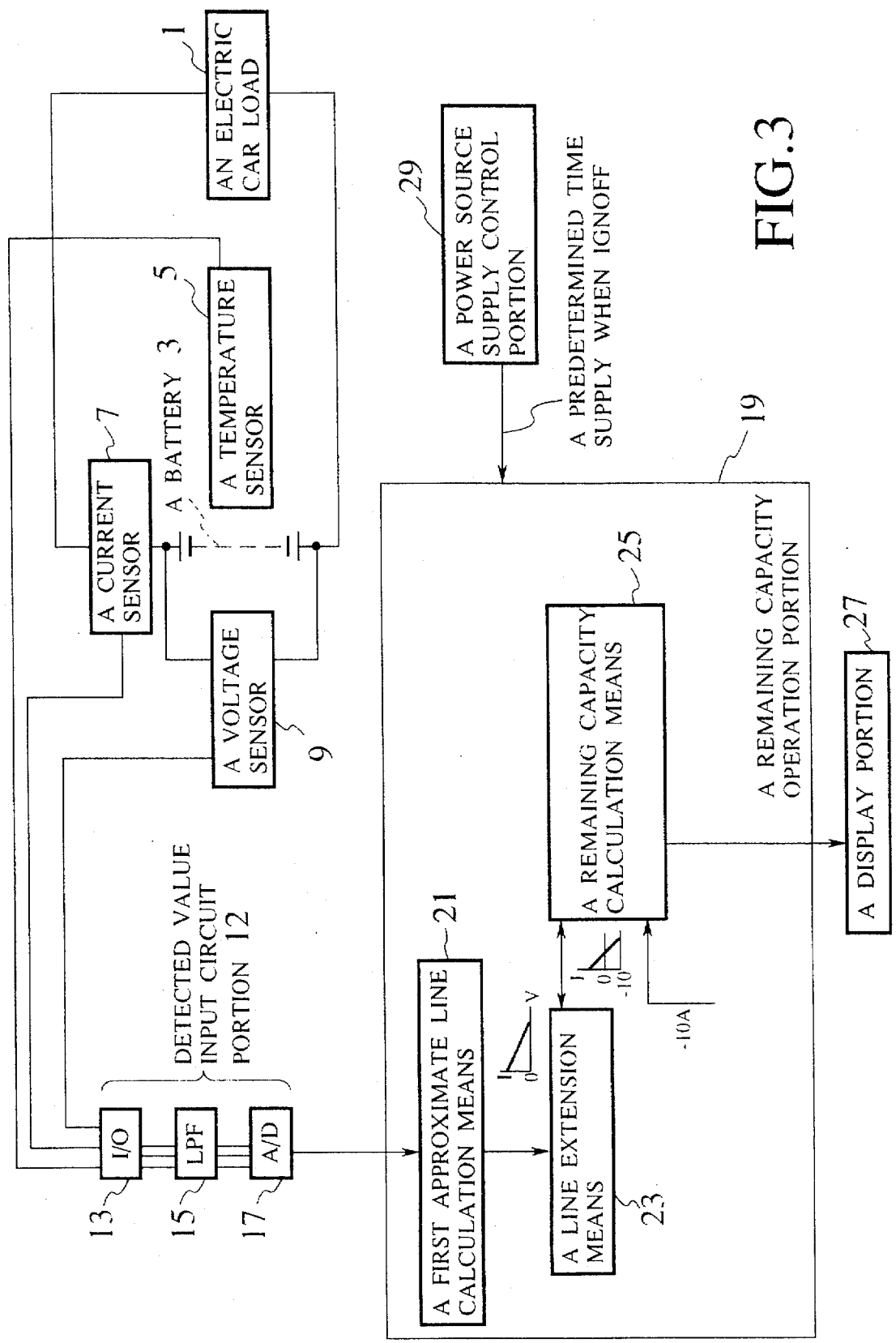
FIG. 3 is a block diagram showing a schematic configuration of a battery remaining capacity measuring apparatus according to the invention.

FIG. 3 shows a schematic configuration of a battery remaining capacity measuring apparatus according to embodiments of the invention. In FIG. 3, a numeral 1 denotes an electric car (for example, a motor) connected to a battery 3. A numeral 7 denotes a current sensor detecting a current passing through an electric car load (as referred to a load below). A numeral 9 denotes a voltage sensor detecting a terminal voltage of a battery 3.

A numeral 12 denotes a detected value input circuit portion. A detected value input portion 12 comprises I/O port 13, low-pass filter (LPF) 15 and A/D converter 17, where a discharge current and a terminal voltage of a battery are inputted from a voltage sensor 9 and a current sensor 7 as a detected voltage and a detected current, and a noise is eliminated, and a detected voltage and a detected current are converted to digital.

A numeral 19 denotes a remaining capacity operation portion. A program of a remaining capacity operation portion 19 comprises an approximate line calculation means 21, a line extension means 23 and a remaining capacity calculation means 25, connected to a display portion 27 and a power supply portion 29.

An approximate line calculation means 21 stores a closed circuit voltage of a battery 3 from a detected input circuit portion 12 depending on supply of a power source. When an electric car starts running, an approximate line calculation means 21 samples a predetermined number of a closed circuit voltage and a current passing through a load 1 respectively when a battery 3 is connected to a load. Where, an approximate linear function $I_1$ is obtained by using a method of least squares in order to shows a change of a discharge characteristic of a battery 3 until a remaining capacity reaches "0" according to a previously detected open circuit voltage, these closed circuit voltages and currents.

Figure 4:
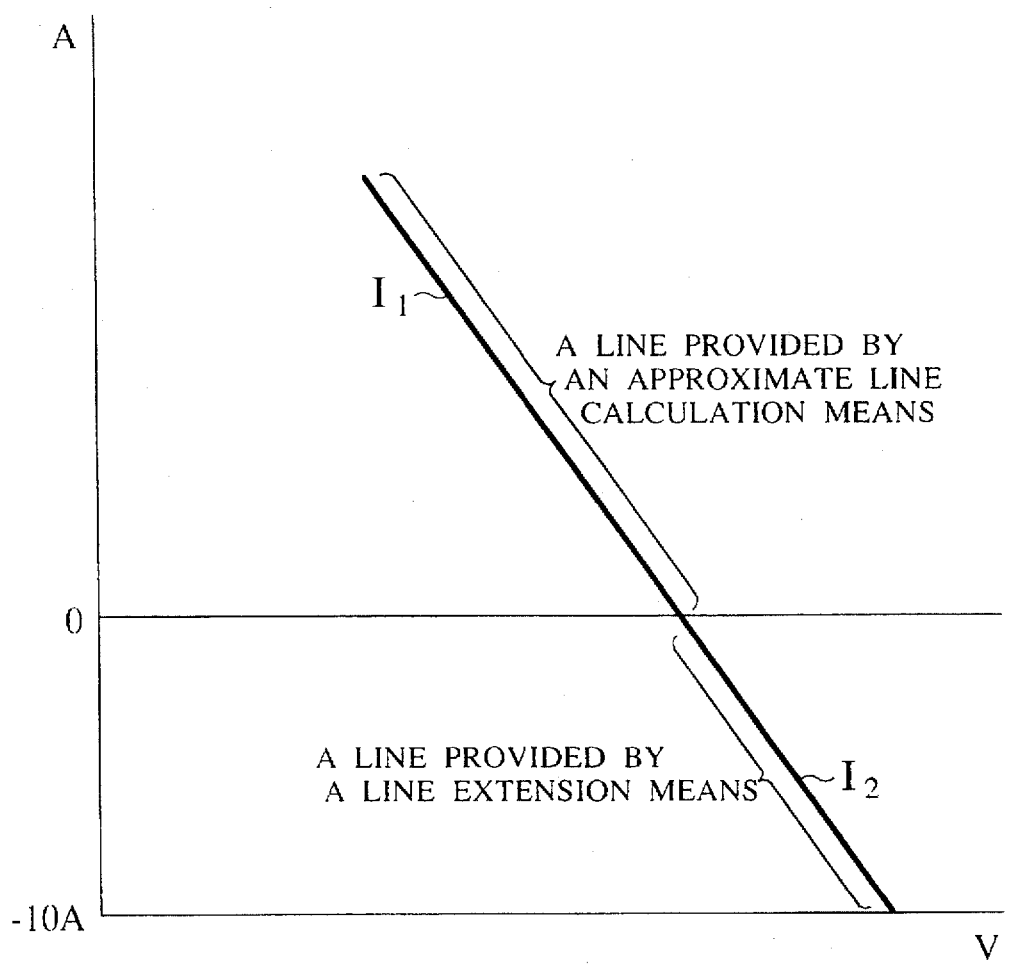
FIG. 4 is a diagram showing an extension of an appropriate line.

As shown in FIG. 4, when an approximate linear function $I_1$ is obtained, a line extension means 23 provides an approximate linear function $I_2$, which is extended on a coordinate axis having a previously established $-Y$ axis and $+X$ axis.

Figure 5:
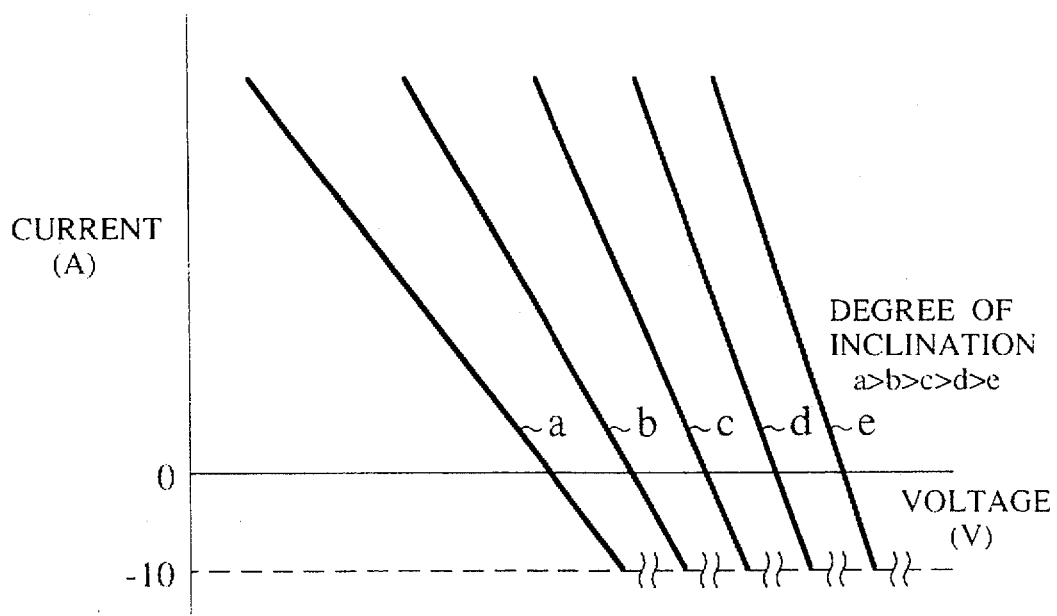
FIG. 5 is a diagram showing a reason for extending an appropriate line.

Since a remaining voltage reduces as time passes by, the approximate linear function $I_2$ is provided. For example, this is explained below by assuming that time a is the longest time. As shown in FIG. 5, each approximate linear function $I_1$ obtained by an approximate line calculation means 21 has respectively a different inclination with passage of time.

FIG. 5 shows an approximate line a on time a, an approximate line b on time b, an approximate line c on time c, an approximate line d on time d and an approximate line e on time e, respectively, which are arranged in a–e order and are inclined to be vertical.

By the way, at −10 [A] point, a ratio of a voltage change of each line is equally spaced as shown in FIG. 5.

That is, whenever an approximate linear function $I_2$ is obtained, a remaining capacity voltage obtained by submitting −10 [A] reduces at a equal interval as time passes.

Accordingly, an approximate linear function $I_1$ is extended in order to obtain an approximate linear function $I_2$, so that a remaining capacity voltage can be obtained.

An approximate linear function $I_2$ which is created by extending an approximate linear function $I_1$ is used, while a simple value is not used. The reason is as follows. Even if a remaining capacity calculation means 25 must change a reference value due to a different kind of battery, it is possible to immediately obtain a remaining capacity voltage with a precision by substituting an approximate value to −10 [A].

When obtaining a approximate linear function $I_2$ a remaining capacity calculation means 25 finds a voltage at a point where a previously set reference value (−10 [A]) crosses at an approximate linear function $I_2$ in order to obtain a remaining capacity voltage.

Additionally, a remaining capacity is displayed according to a ratio of a previously stored open circuit voltage on full-charging to this remaining capacity voltage.

A power source supply control portion 29 provides a remaining capacity operation portion 19 with a power source only for a predetermined period at a predetermined time (a time when a battery is not connected to a load) after ignition off. Even in case of making ignition on just after ignition off, it is possible to display a remaining capacity voltage just before ignition off.

Figure 6:
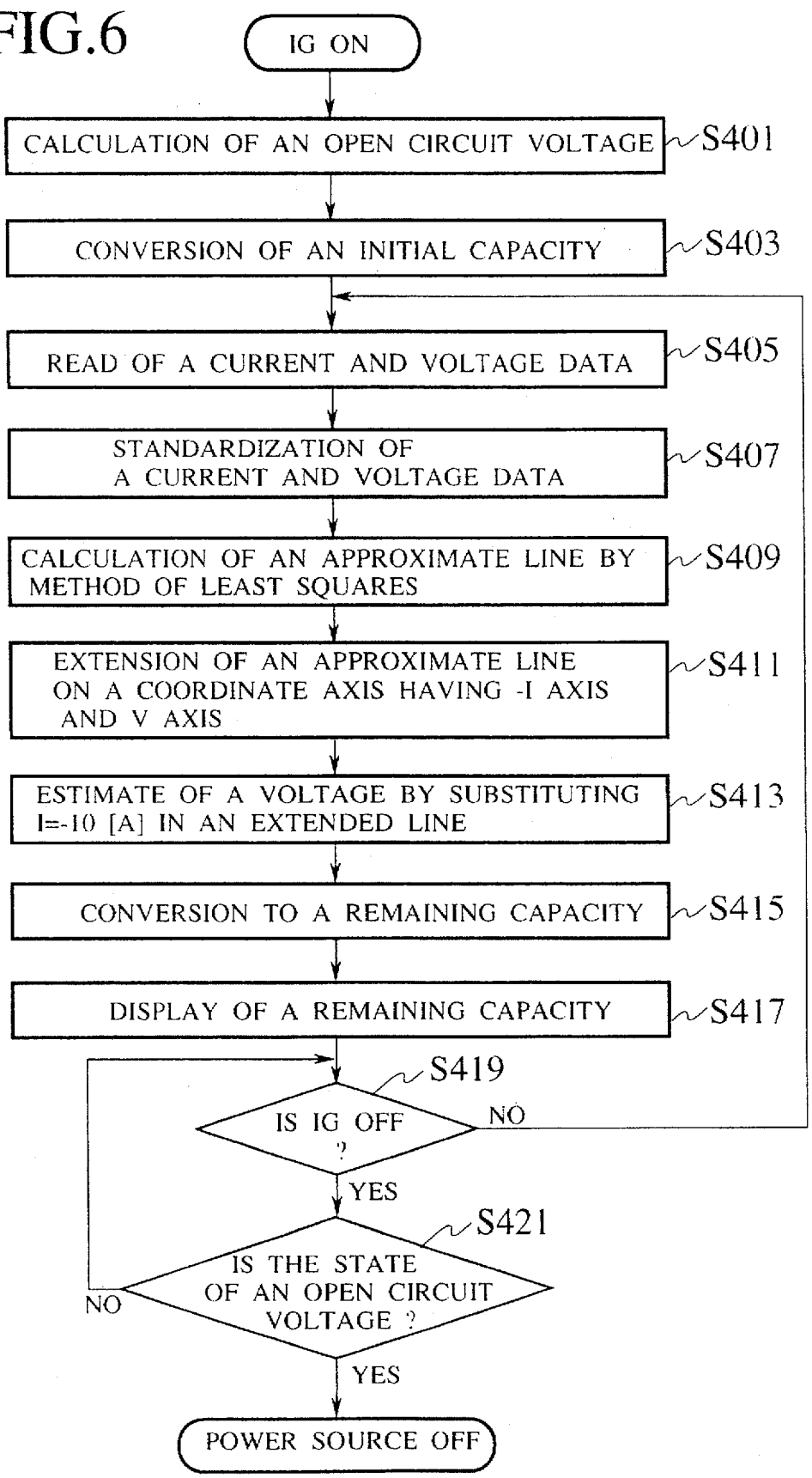
FIG. 6 is a flow chart showing an operation according to the invention.

As described above, the battery remaining capacity measuring apparatus is explained below. FIG. 6 is a flow chart showing an operation according to embodiments of the invention.

When an ignition is on and a power source is provided from a power source supply control portion 28, an approximate linear calculation means 21 in a remaining capacity operation portion 19 takes a voltage detected by a voltage sensor 9, and then stores it as an initial open circuit voltage of a battery 3 (S401).

Next, a remaining capacity calculation means 25 converts to percentage according to a ratio of an open circuit voltage on full-charging to the initial open circuit voltage (that is, converts an initial capacity), which is displayed in a display portion 17 (S403).

Next, when an electric car starts to run and a voltage of a battery 3 is applied to an open circuit voltage, an approximate line calculation means 21 reads a terminal voltage of a battery 3 which a voltage sensor 9 detects and a current (also called as a discharge current) which a current sensor 7 detects (S405). Where, these sampling data are standardized (S407). By using these standardized data, a method of least squares is operated in order to calculate an approximate linear function $I_1$ (I=aV+b) (S409). This approximate linear function $I_1$ (I=aV+b) can be obtained according to the following equations.

The way is to find I=aV+b by using a method of least squares of a linear equation.

Assuming that a sum of squared error between a calculated value and an actual measured value is S, $$S=\Sigma\{Ii-(aVi+b)\}^2 \quad (1)$$

According to the above equation, S is found in order to make S differentiated by a and b "0".

$$\partial S/\partial b = 2\sum_{i=1}^{n} b + 2\sum_{i=1}^{n} Via - 2\sum_{i=1}^{n} Ii = 0$$

$$\vdots$$

$$\partial S/\partial b = 2\sum_{i=1}^{n} Vib + 2\sum_{i=1}^{n} V^2a - 2\sum_{i=1}^{n} Vi\,i = 0$$

A simultaneous equation of both equations is solved below.

$$a = \frac{\sum_{i=1}^{n} Vi\,Ii - \left(\sum_{i=1}^{n} Vi \sum_{i=1}^{n} Ii\right)/n}{\sum_{i=1}^{n} V^2 - \left(\sum_{i=1}^{n} Vi\right)^2/n}$$

$$b = \sum_{i=1}^{n} Ii/n - \sum_{i=1}^{n} Vi(a/n)$$

As a result, a value of V (a voltage) is obtained when I (a current) is arbitrary, by V=(I−b)/a.

Next, as shown in FIG. 4, when an approximate linear function $I_1$ is obtained, a line extension means 23 extends an approximate linear function $I_1$ onto a coordinate axis having −Y axis and +X axis in order to create an approximate linear function $I_2$ (S411).

Furthermore, when an approximate linear function $I_1$ is obtained, a remaining capacity calculation means 25 finds an intersecting point a reference value (−10 [A]) which is previously set and an approximate linear function $I_2$ in order to display a remaining capacity voltage (S413).

Concretely, since an approximate linear function $I_2$ is shown by I=aV+b, a remaining capacity voltage can be obtained by simply substituting I=−10.

A remaining capacity voltage is found according to a ratio of a previously stored open circuit voltage on full-charging to this remaining capacity voltage (S415), which is displayed in a display portion 27 (S417). Next, S419 discriminates whether an ignition is off or not. When an ignition is not off, an operation is implemented in S415, and then a remaining capacity voltage can be obtained by substituting I=−10 in an approximate linear function $I_2$ as described above.

Figure 7:
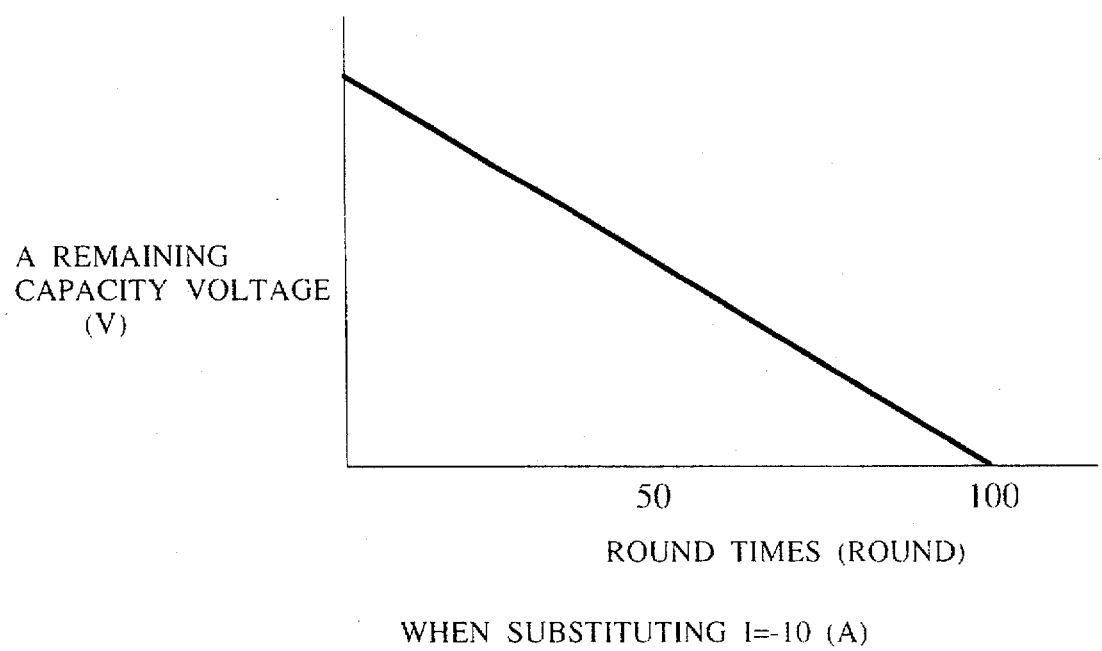
FIG. 7 is a diagram showing a change of a remaining capacity voltage when substituting a reference value (I=−10).

Accordingly, as shown in FIG. 7, for example, if an electric car makes 100 rounds at a predetermined place when a predetermined load is applied and the remaining capacity voltages are plotted, a remaining capacity voltage may reduce approximately in a straight line.

Next, when an ignition is off, S421 discriminates whether a load is disconnected to a battery or not. If a load is connected to a battery, an operation returns to S419 until an ignition gets off. Where, an approximate linear function is found by a method of least squares, and then the approximate line is extended in order to calculate a remaining capacity.

Furthermore, when a load is disconnected to a battery, a power source supply control portion 29 stops providing a power for a remaining capacity operation portion 19. That is, supply of a power source stops when running stops completely.

Although a battery remaining capacity measuring apparatus used in an electric car is explained according to the above mentioned embodiments of the present invention, it is possible to apply it to an apparatus where a discharge current changes intensely or stably.

What is claimed is:

1. A battery remaining capacity measuring apparatus for measuring an open circuit until a battery is connected to a load together with a start of an operation, measuring a plurality of a closed circuit voltage and a current for every predetermined time after a state of said closed circuit, and obtaining an approximate linear function which shows a voltage-current characteristic according to said voltage and current, said apparatus comprising:

a remaining capacity operation portion for obtaining a voltage value whereby a reference value (I<0) is substituted in said approximate linear function whenever said approximate linear function, and displaying said voltage value as a remaining capacity operation portion.

2. A battery remaining capacity measuring apparatus according to claim 1, wherein said remaining capacity operation portion comprising:

line extension means for creating an approximate line where an approximate linear function is extended on a coordinate axis having −I axis and +V axis; and remaining capacity calculation means for obtaining a voltage value on an intersecting point where an approximate line crosses at a reference value (I<0), and displaying the voltage value as a remaining capacity voltage.

* * * * *